United States Patent [19]

Tseng et al.

[11] Patent Number: 5,780,360

[45] Date of Patent: Jul. 14, 1998

[54] PURGE IN SILICIDE DEPOSITION PROCESSES DICHLOROSILANE

[75] Inventors: Jennifer Meng Chu Tseng; Mei Chang, both of Saratoga; Ramanujapuram A. Srinivas, San Jose; Klaus-Dieter Rinnen, Palo Alto, all of Calif.; Moshe Eizenberg, Haifa, Israel; Susan Weihar Telford, Untergruppenbach, Germany

[73] Assignee: Applied Materials, Inc., Santa Clara, Calif.

[21] Appl. No.: 666,976

[22] Filed: Jun. 20, 1996

Related U.S. Application Data

[62] Division of Ser. No. 314,161, Sep. 27, 1994, abandoned.

[51] Int. Cl.$^6$ .................................................. H01L 21/28
[52] U.S. Cl. ........................ 438/680; 438/683; 438/905
[58] Field of Search .................................. 437/200, 234, 437/241, 588; 148/DIG. 27, DIG. 147; 438/680, 683, 905, 360, 394, 401

[56] References Cited

U.S. PATENT DOCUMENTS

| 4,737,474 | 4/1988 | Price et al. | 437/192 |
|---|---|---|---|
| 4,842,892 | 6/1989 | Smith et al. | 427/39 |
| 4,902,645 | 2/1990 | Ohba | 437/200 |
| 4,951,601 | 8/1990 | Maydan et al. | 118/719 |
| 4,966,869 | 10/1990 | Hillman et al. | 437/200 |
| 5,231,056 | 7/1993 | Sandhu | 437/200 |
| 5,272,112 | 12/1993 | Schmitz et al. | 437/192 |
| 5,326,723 | 7/1994 | Petro et al. | 437/192 |
| 5,436,200 | 7/1995 | Tanaka | 437/192 |
| 5,447,887 | 9/1995 | Filipick et al. | 437/200 |
| 5,500,249 | 3/1996 | Telford et al. | 437/200 |

FOREIGN PATENT DOCUMENTS

| 0 437 110 A2 | 1/1990 | European Pat. Off. . |
|---|---|---|
| 0 437 110 A3 | 7/1991 | European Pat. Off. . |
| 63 120 419 | 5/1988 | Japan . |
| 02 237 025 | 9/1990 | Japan . |
| 04 294 532 | 10/1992 | Japan . |

OTHER PUBLICATIONS

362 Japanese Journal of Applied Physics 29 (1990) Jan., No. 1, Part 2, Tokyo, JP, "Effect of Silicon Surface Cleaning on the Initial Stage of Selective Titanium Silicide Chemical Vapor Deposition", Kunio Saito, Takao Amazawa and Yoshinobu Arita, (Received Sep. 7, 1989, accepted for publication Dec. 6, 1989), pp. L 185–L 187.

(List continued on next page.)

*Primary Examiner*—John Niebling
*Assistant Examiner*—Thomas G. Bilodeau
*Attorney, Agent, or Firm*—Patterson & Streets, LLP

[57] ABSTRACT

A method of processing a substrate, such as a semiconductor wafer, in a vacuum processing chamber includes the steps of depositing a material on a surface of the substrate using a gas mixture, and purging the chamber of residual gases by flowing $SiH_4$ into the chamber. Preferably, $WSi_x$ is deposited on a semiconductor wafer using a mixture comprising $WF_6$, dichlorosilane and a noble gas, and the chamber is subsequently purged of residual $WF_6$ and dichlorosilane by flowing $SiH_4$ into the chamber. A further method of processing a substrate in a vacuum processing chamber includes the step of conditioning the chamber by flowing $SiH_4$ into the chamber prior to depositing a material on the surface of the substrate. Semiconductor wafers processed according to the inventive method are characterized by more uniform sheet resistance values and reduced film stress. A vacuum processing apparatus is also provided for practicing methods of the invention and includes a chamber, means for depositing a material, such as $WSi_x$, on a surface of a substrate disposed within the chamber, and means for purging the chamber with $SiH_4$.

13 Claims, 9 Drawing Sheets

OTHER PUBLICATIONS

1046 Journal of the Electrochemical Society 140 (1993) Dec., No. 12, Hooksett, NH, US, "Chemically Vapor Deposited Tungsten Silicide Films Using Dichlorosilane in a Single–Wafer Reactor, Growth, Properties, and Thermal Stability", S.G. Telford, M. Elizenberg, M. Chang and A.K. Sinha, pp. 3689–3701.

1046(b) Extended Abstracts Fall Meeting, Hollywood, FL, US89/2 (1989), Princeton, NJ, US, Absteract No. 372, "Film Nucleation Uniformity of Tungsten Silicide Deposited Using Dischlorosilane Reduction", T. Hara, H.hatiwars and T. Miyasoto, Dept. of Electrical Engineering Hosel University, p. 543.

IBM Technical Disclosure Bulletin, S. Basavaiah and R.V. Joshi, vol. 34, No. 3, Aug. 1991, "Stoichiometric CVD $Wsi_2$ Flows", p. 77.

```
┌─────────────────────────────────────────────────────────┐
│  INTRODUCING A SEMICONDUCTOR WAFER INTO A CHAMBER       │
│         OF A VACUUM PROCESSING APPARATUS                │
└─────────────────────────────────────────────────────────┘
                            │
┌─────────────────────────────────────────────────────────┐
│           FLOWING SiH$_4$ INTO THE CHAMBER              │
└─────────────────────────────────────────────────────────┘
                            │
┌─────────────────────────────────────────────────────────┐
│  DEPOSITING WSi$_x$ ON A SURFACE OF THE SEMICONDUCTOR   │
│  WAFER USING A MIXTURE COMPRISING WF$_6$, DICHLOROSILANE│
│                    AND A NOBLE GAS                      │
└─────────────────────────────────────────────────────────┘
                            │
┌─────────────────────────────────────────────────────────┐
│  AT LEAST PARTIALLY PURGING THE APPARATUS BY FLOWING    │
│         DICHLOROSILANE INTO THE APPARATUS               │
└─────────────────────────────────────────────────────────┘
                            │
┌─────────────────────────────────────────────────────────┐
│  PURGING THE CHAMBER BY FLOWING SiH$_4$ INTO THE CHAMBER│
│       AFTER CEASING THE FLOW OF DICHLOROSILANE          │
│                   INTO THE APPARATUS                    │
└─────────────────────────────────────────────────────────┘
                            │
┌─────────────────────────────────────────────────────────┐
│    REMOVING THE SEMICONDUCTOR WAFER FROM THE CHAMBER    │
└─────────────────────────────────────────────────────────┘
```

*Fig. 5*

PURGE IN SILICIDE DEPOSITION PROCESSES DICHLOROSILANE

This application is a divisional application of U.S. patent application Ser. No. 08/314,161, filed Sep. 27, 1994, now abandoned, entitled "Utilization of SiH$_4$ Soak and Purge in Deposition Processes."

BACKGROUND OF THE INVENTION

1. Field of the Invention

The present invention relates to an improved chemical vapor deposition process, such as a process for the deposition of tungsten silicide (WSi$_x$) from tungsten hexafluoride (WF$_6$) and dichlorosilane (DCS). More particularly, the present invention relates to a process including a novel silane (SiH$_4$) purge step subsequent to deposition of WSi$_x$ on a substrate. The present invention further relates to a process including a novel SiH$_4$ soak step prior to deposition of WSi$_x$ on a substrate.

2. Description of the Related Art

Tungsten silicide (WSi$_x$) thin films have been deposited by low pressure chemical vapor deposition (LPCVD) onto semiconductor substrates using silane (SiH$_4$) and tungsten hexafluoride (WF$_6$) as the precursor gases. Typically, the WSi$_x$ thin film is deposited onto a semiconductor wafer having a layer of silicon oxide beneath a polysilicon layer. The foregoing process, however, has proven less than completely satisfactory.

One problem with the foregoing process is that the deposited coating is not as conformal over stepped topographies as is desired. Another problem is that films so deposited have a high residual fluorine content that adversely affects device performance. For example, when the wafer is exposed to elevated temperatures, e.g., about 850° C. or higher, as during annealing, the excess fluoride ions migrate through the underlying polysilicon layer and into the underlying silicon oxide layer. The effective thickness of the silicon oxide layer thus appears to increase. This effective thickness increase in turn leads to an adverse change in electrical properties of semiconductor devices including such layers.

When using a multichamber vacuum processing system such as that described in U.S. Pat. No. 4,951,601, to Maydan et al., incorporated herein by reference, the substrate to be coated with tungsten silicide first is cleaned using a fluorine plasma scrub to remove native oxide from the polysilicon layer. The cleaned substrate is then transferred into a substrate transfer chamber. This transfer chamber has a nitrogen or argon atmosphere (subatmospheric) to prevent re-oxidation of the substrate, and contains a robot to transfer the substrate into a processing chamber, e.g., a tungsten deposition chamber, through a slit valve having an O-ring seal. This CVD process has become the standard for depositing tungsten suicide from SiH$_4$ and WF$_6$. However, as substrates become larger, and feature sizes for devices become smaller, the above problems of step coverage and residual fluorine using this deposition process have become critical limitations for future applications.

An improved process for depositing WSi$_x$ films using dichlorosilane (DCS) instead of SiH$_4$ has been proposed. The resultant WSi$_x$ films have reduced fluorine content and are more conformal than those deposited using SiH$_4$ as the precursor gas, thereby providing a solution to the SiH$_4$-based deposition process limitations. In order to deposit WSi$_x$ films which have good conformality, low fluoride content and good adhesion to a substrate such as a silicon wafer (which can have one or more layers thereon), it has been found beneficial to exclude nitrogen from the deposition chamber during the deposition process. Such an improved process is provided by copending application Ser. No. 08/136,529, filed Oct. 14, 1993, now abandoned by Chang et al., which is incorporated herein by reference. In this process (the "DCS process"), tungsten silicide thin films are made by passing WF$_6$, DCS and a noble carrier gas into a tungsten deposition chamber from which nitrogen is excluded.

In deposition processes, it is customary to purge the deposition chamber and gas delivery lines after each semiconductor wafer is processed in order to remove residual reactive and carrier gases from the chamber and the delivery lines. The DCS process described above typically includes a purge step employing DCS as the purge gas.

It has been found, however, that depositing WSi$_x$ on semiconductor wafers according to the DCS process is associated with a noticeable downward drift in the sheet resistance of wafers so processed, over both short and long terms. Using the DCS process, the sheet resistance has been observed to decrease by 2 Ω/square over the course of processing 25 wafers. This short-term resistivity drift amounts to a decrease of 5% or more. A long-term resistivity drift over the course of processing 500 wafers, amounting to 4–5 Ω/square, has also been observed.

A need exists for an improvement in the known DCS deposition process which reduces the observed short- and long-term downward drifts in sheet resistivity.

SUMMARY OF THE PREFERRED EMBODIMENTS

In accordance with one aspect of the present invention, a substrate, such as a semiconductor wafer, is processed in a chamber of a vacuum processing apparatus by depositing a material on a surface of the substrate using a gas mixture, and purging the chamber of residual gases remaining from the depositing step by flowing SiH$_4$ into the chamber.

In a more particular aspect of the invention, WSi$_x$ is deposited on a surface of a semiconductor wafer using a mixture comprising WF$_6$, dichlorosilane and a noble carrier gas, and the chamber is subsequently purged of residual WF$_6$ and dichlorosilane by flowing SiH$_4$ into the chamber.

According to a further aspect of the present invention, an optional DCS partial purge is carried out after WSi$_x$ deposition and prior to the SiH$_4$ purge.

In accordance with yet another aspect of the present invention, SiH$_4$ is employed to condition a vacuum processing chamber prior to a deposition process. The SiH$_4$ conditioning step can be employed independently of, or in combination with, the foregoing SiH$_4$ purge step as part of a method for processing substrates in a vacuum deposition chamber.

According to an additional aspect of the present invention, semiconductor wafers processed according to the foregoing processes are also provided. The wafers so produced are characterized by reduced variation in sheet resistance, and are further characterized by reduced film stress as deposited.

In accordance with still another aspect of the present invention, there is provided a vacuum processing apparatus comprising a chamber, means for depositing a material, such as WSi$_x$, on a surface of a substrate disposed within the chamber, and means for purging the chamber with SiH$_4$.

Preferred means for depositing the material on the substrate surface include a source of at least one reactive gas and means for introducing the reactive gas into the chamber. Particularly preferably, the apparatus includes sources of $WF_6$, DCS and a noble carrier gas, and means for combining the gases to form a reactive gas mixture.

Means for purging the chamber with $SiH_4$ preferably include a source of $SiH_4$ and means for introducing the $SiH_4$ into the chamber.

Other objects, features and advantages of the present invention will become apparent to those skilled in the art from the following detailed description. It is to be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

BRIEF DESCRIPTION OF THE DRAWINGS

The invention may be more readily understood by referring to the accompanying drawings in which FIG. 5 is a flowchart illustrating an exemplary method for processing a semiconductor wafer according to the invention, and FIGS. 6A-D are graphs showing the variation of sheet resistance (◊) and uniformity (□) for semiconductor wafers processed according to the methods described for FIGS. 3 and 4, wherein FIGS. 6A-B show the variations observed after production of 25 wafers for the conventional and inventive processes, respectively, and FIGS. 6C-D show the variations observed after production of 500 wafers for the conventional and inventive processes, respectively.

DETAILED DESCRIPTION OF THE PREFERRED EMBODIMENTS

We have discovered that use of silane, or more precisely monosilane ($SiH_4$), to purge a tungsten deposition chamber after depositing $WSi_x$ on semiconductor wafers using $WF_6$ and DCS substantially reduces the short- and long-term downward drift in sheet resistance of the semiconductor wafers so processed. Using methods of the present invention, all benefits of the known DCS deposition processes are retained, with the additional benefit that the short- and long-term drifts in sheet resistance are reduced from about 5% to less than about 3%. Thus, semiconductor wafers processed according to the present invention display reduced variation in sheet resistance.

We have also unexpectedly discovered that, as a result of the inventive methods, stress in the deposited $WSi_x$ film is significantly reduced.

Methods according to the invention can, if desired, be carried out employing conventional chemical vapor deposition (CVD) systems used to practice the known DCS processes, without the need for modifications to the vacuum deposition chamber. For example, a method of the invention can be carried out using the apparatus provided by Applied Materials, Inc. as described by Chang et al. in U.S. application Ser. No. 08/136,529.

However, the methods of the present invention are not to be considered to be confined in their application to the use of such apparatus. In particular, the methods of the present invention may be carried out using a multichamber processing system rather than a single chamber processing system.

Figure 1:
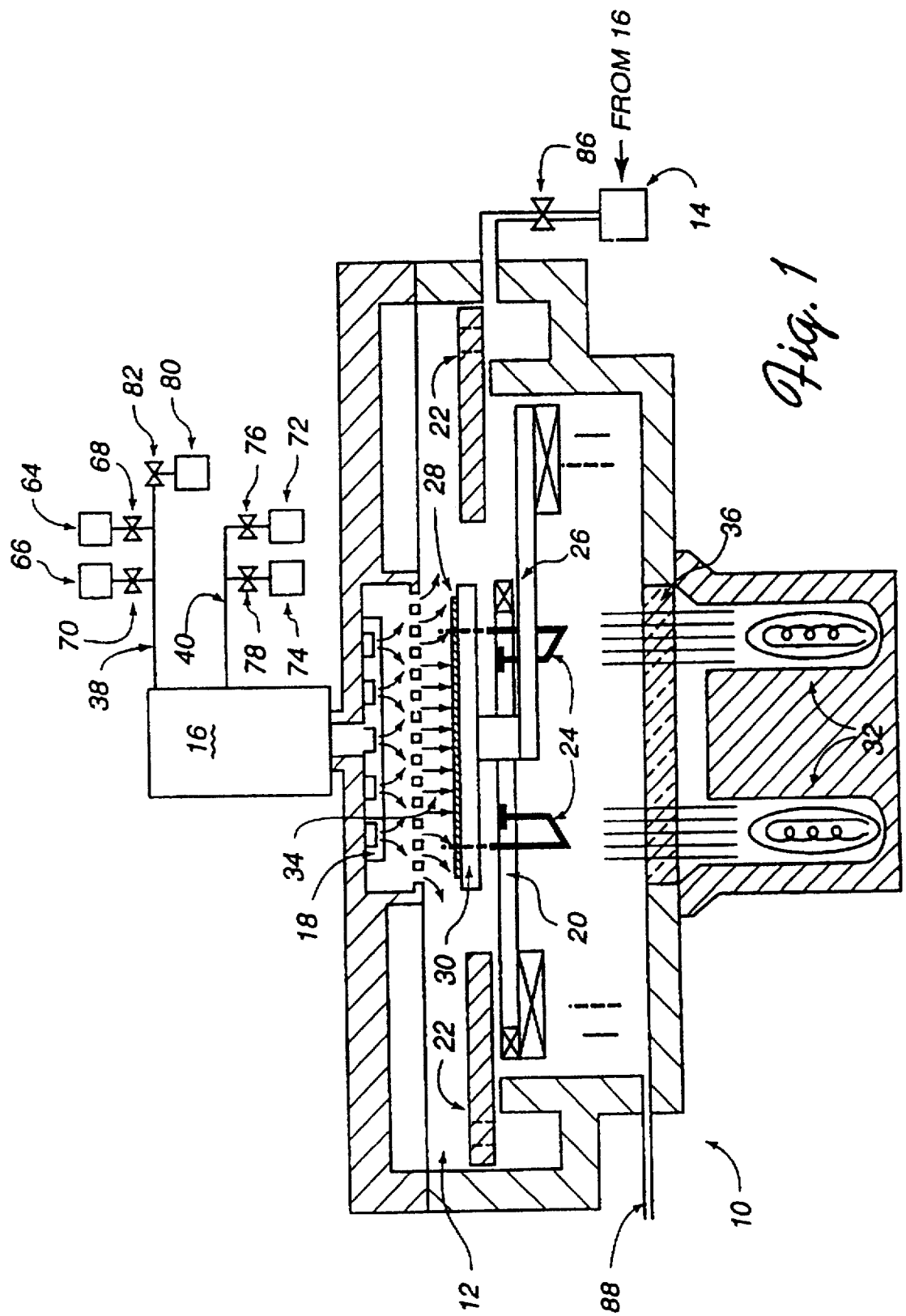
FIG. 1 is a schematic cross-sectional view of an exemplary vacuum processing apparatus, more specifically a tungsten deposition chamber, which is useful in practicing a method of the present invention.

Referring now to FIG. 1, a CVD system 10 comprises deposition chamber 12, vacuum exhaust system 14, gas combining assembly generally indicated at 16, diffuser 18, wafer lift 20, baffle plate 22, lift fingers 24 and susceptor lift 26. A substrate 28, such as a silicon wafer having a layer of polysilicon thereon, is disposed on a support or susceptor 30.

Heating means 32 maintains a uniform temperature during processing of the susceptor 30 and the substrate 28 mounted thereon. The deposition or reaction zone 34 lies above the substrate.

In the illustrated embodiment, heating means 32 is an external array of 1000 watt lamps directing collimated light through quartz window 36. Other known heating means can also be employed. A particularly useful heating means 32 comprises resistive heating means rather than lamps. When resistive heating means are employed, quartz window 36 can be omitted. Thus, use of resistive heating means obviates the need for periodic cleaning and/or replacement of the quartz window, with attendant maintenance and downtime expenses.

A preferred vacuum processing apparatus including resistive heating means which can be employed in the practice of the present invention is described in copending U.S. patent application Ser. No. 08/200,074, filed Feb. 23, 1994, now U.S. Pat. No. 5,376,311, by Lei et al., which is incorporated herein by reference.

Gas combining assembly 16 can include a gas box or plenum and one or more valves for controlling the flow of the various process gases, including purge gases, carrier gases, reactive gases for deposition of $WSi_x$ or other materials, and cleaning gases such as $NF_3$ for periodic chamber cleaning processes. Alternatively, gas mixing assembly 16 may be omitted and all process gases delivered directly to chamber 12 via diffuser 18. This alternative may, however, result in greater non-uniformity and thus may be less preferred for certain applications.

Figure 2:
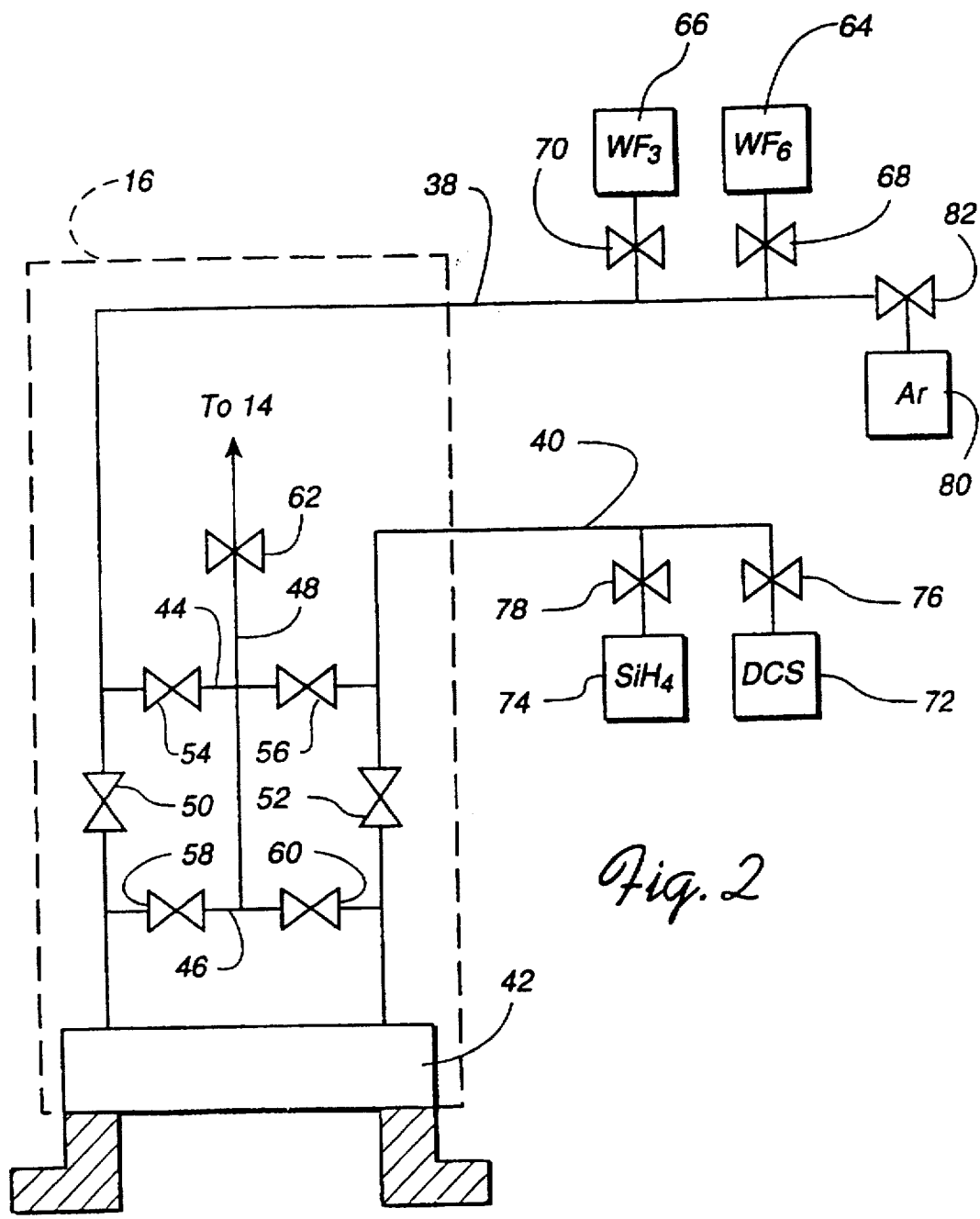
FIG. 2 is a detailed schematic diagram of a preferred gas mixing assembly generally indicated in FIG. 1.

FIG. 2 illustrates an exemplary gas combining assembly 16. Feed lines 38 and 40 deliver process gases into plenum 42 and subsequently into chamber 12 via diffuser 18. Feed lines 38 and 40 are linked by mixing lines 44 and 46, which in turn are joined by divert line 48. Valves 50 and 52 are disposed between mixing lines 44 and 46 on feed lines 38 and 40, respectively. Inlet mixing valves 54 and 56 are disposed on mixing line 44 as shown, and outlet mixing valves 58 and 60 are correspondingly disposed on mixing line 46. Divert valve 62 is disposed on divert line 48.

Sources of process gases are connected to feed lines 38 and 40. Preferably, fluorine-containing gas sources are connected to one of feed lines 38 and 40, while silicon-containing gas sources are connected to the remaining feed line. As shown in FIGS. 1 and 2, $WF_6$ source 64 and $NF_3$ cleaning gas source 66 are connected to feed line 38 via supply valves 68 and 70, respectively. DCS source 72 and $SiH_4$ source 74 similarly are connected to feed line 40 via supply valves 76 and 78, respectively. Noble gas source 80, which preferably is a source of argon, is connected to feed lines 38 via supply valve 82.

When process gases are not flowing into chamber 12, the default settings of the various valves are as follows: valves 50 and 52 are open; all other valves are closed.

Returning to FIG. 1, the deposition process begins with the entry of process gases (i.e., reaction and carrier gases) into the deposition chamber 12 via gas combining assembly 16 and "showerhead" type diffuser 18. A conventional process mixture includes DCS, $WF_6$ and argon. Gas combining assembly 16 mixes the process gases upstream of diffuser 18, ensuring that the gas mixture is of uniform composition before being supplied to the diffuser 18. The diffuser 18 has numerous openings over an area corresponding to that of the substrate 28 beneath it. The spacing between the diffuser 18 and the substrate 28 can be adjusted to from about 200–1000 mils (5–25 mm) to define the reaction zone 34. The diffuser 18 feeds the combined process gases to the reaction zone 34.

The area of the chamber below the plane of the susceptor 30 is purged via bottom purge line 88 with a noble gas, preferably argon, to prevent reactive gases from extending into the area of the chamber 12 below the susceptor 30.

The base pressure in the chamber is about 10 millitorr. Exhaust system 14 is fitted with a throttle valve 86 which can regulate the pressure of the chamber.

In the illustrated embodiment of a method of the present invention, three gases, a noble carrier gas (e.g., argon), $WF_6$ and DCS, are mixed in gas combining assembly 16. $WF_6$ is introduced from source 64 into gas combining assembly 16 through feed line 38 by opening supply valve 68. The $WF_6$ preferably is introduced into gas combining assembly 16 together with the noble carrier gas, which is delivered from source 80 by opening supply valve 82. Dichlorosilane from source 72 is introduced into gas combining assembly 16 through feed line 40 by opening supply valve 76.

The noble carrier gas preferred herein for reasons of economy is argon, but other noble gases can also be used. As mentioned above, nitrogen should not be used in accordance with the present process and should be excluded from the process.

Mixing of the process gases is effected in gas combining assembly 16 by closing valves 50 and 52 and outlet mixing valves 58 and 60, and opening inlet mixing valves 54 and 56 and divert valve 62. The gases partially mix in mixing line 44, and initially flow through divert line 48 to exhaust system 14 until the flow is stabilized. After stabilization, divert valve 62 is closed and outlet mixing valves 58 and 60 are opened. The partially mixed gases return through mixing line 44 to feed lines 38 and 40, then enter plenum 42 where mixing is completed. The mixed process gases subsequently enter chamber 12 via diffuser 18.

The tungsten silicide deposition is generally carried out at from about 500°–600° C., preferably at about 550° C. The pressure during deposition can be from about 0.3–10 torr, but preferably is carried out at about 0.7–1.5 torr.

In a typical process, the flowrates of process gases into chamber 12 are related to the volume of the chamber. For an exemplary apparatus including a chamber adapted to process a semiconductor wafer having a diameter of 8" (200 mm), a typical chamber volume is about 6 L. A semiconductor wafer having a diameter of 6" (150 mm) can also be processed in a chamber of this volume. For such an apparatus, an appropriate flowrate of $WF_6$ is about 1–6 sccm, preferably about 3.5 sccm. Dichlorosilane is passed into chamber 12 at a flowrate of about 130–300 sccm, preferably at about 175 sccm. Argon is used as the carrier gas and is passed into chamber 12 via line 38 at a flowrate of about 100–1000 sccm, preferably at 300–600 sccm. This argon flowrate is exclusive of the bottom purge flowrate, about 100–500 sccm, preferably about 300 sccm. The various flowrates are adjusted so as to obtain a $WSi_x$ layer having a resistivity of between 700 and 1400 μΩ-cm, preferably about 800 μΩ-cm. Deposition is most preferably carried out at 550° C. and 1 torr.

After the deposition process is completed, but before the $SiH_4$ purge step is initiated, it is preferred to carry out an optional partial purge step using DCS. The optional DCS purge step is carried out by simply closing supply valve 68 to stop the flow of $WF_6$ into the deposition chamber 12, while maintaining the previously established flow of DCS and argon into chamber 12. The optional DCS purge is carried out for 0 to about 5 seconds, preferably about 2–3 seconds. The DCS flowrate during this optional purge step is about 130 to 300 sccm, preferably about 175 sccm. Preferred temperatures are as indicated for the deposition step.

The optional DCS purge helps to remove any remaining $WF_6$ from gas combining assembly 16. This ensures that $WF_6$ does not come into contact with the subsequent flow of $SiH_4$ in gas combining assembly 16.

Subsequent to the deposition process and optional DCS partial purge step, the $SiH_4$ purge, or "cap", step is carried out. Supply valve 76 is closed, ending the flow of DCS from source 72 into chamber 12. If supply valve 68 was not previously closed to end the flow of $WF_6$, it is closed at this time. All mixing valves 54, 56, 58 and 60 are closed, and both valves 50 and 52 are opened. Supply valve 78 is opened, allowing $SiH_4$ to flow from source 74. Supply valve 82 preferably remains open, continuing the flow of argon from source 80. Argon preferably also continues to flow into deposition chamber 12 through bottom purge line 88.

$SiH_4$ from $SiH_4$ source 74 flows through feed line 40 and valve 52 into plenum 42 and thence into chamber 12. Direct flow of the $SiH_4$ through valve 52 again helps to ensure that the $SiH_4$ does not come into contact with, and react with, any $WF_6$ which may remain in gas combining assembly 16.

It is preferred that plenum 42 of gas combining assembly 16 be maintained at a temperature between about 10° C. and 15° C., in order to prevent the $SiH_4$ from decomposing. Preferred cooling means include a water jacket (not shown). Other cooling means may also be employed.

The $SiH_4$ purge step is preferably carried out for a time from about 10 to 30 seconds, more preferably about 15 seconds. The total flowrate of $SiH_4$ into deposition chamber 1 2 is preferably about 100 to 500 sccm, more preferably about 300 sccm. During the $SiH_4$ purge, the total chamber pressure within deposition chamber 12 preferably is maintained at about 0.5 to 1.0 torr, more preferably about 0.7 torr. The temperature during the $SiH_4$ purge preferably is about 500°–600° C., more preferably about 550° C. Preferably the temperature is approximately the same as the temperature at which the deposition step is carried out.

Preferably an argon bottom purge flowrate of about 100 to 500 sccm, more preferably about 300 sccm, is maintained during the $SiH_4$ purge step.

Upon completion of the $SiH_4$ purge step, $SiH_4$ is removed from the deposition chamber 12, gas combining assembly 16 and feed lines 38 and 40. Valve 52 is closed, and mixing valve 56 and divert valve 62 are opened. DCS, preferably combined with argon is passed through feed line 40 and out divert line 48 to exhaust system 14 for about 5 to 10 seconds, preferably about 5 seconds, to purge residual $SiH_4$. DCS does not enter deposition chamber 12 during this step.

Next, argon flow is maintained into deposition chamber 12 for about 5 to 10 seconds, preferably about 5 seconds, to remove residual $SiH_4$ from the chamber. Finally, deposition chamber 12 and all reactive gas feed lines are pumped out to the base pressure of the pump employed (preferably about 5 to 15 millitorr). The foregoing $SiH_4$ removal process is preferably carried out within the ranges of temperatures noted above with reference to the preceding steps.

The purge process is completed at this point, and substrate 28 is ready to be removed from deposition chamber 12.

Periodically, chamber 12 may be cleaned any by conventional means, such as by a plasma cleaning process employing a gas such as $NF_3$. The cleaning gas may be supplied to chamber 12 from source 66 by opening supply valve 70, closing mixing valves 54 and 58, and flowing the cleaning gas through valve 50. The cleaning gas may, if desired, be combined with a noble carrier gas in the usual manner.

According to the present invention, $SiH_4$ can be introduced into a chamber of a vacuum processing apparatus prior to deposition as well as subsequent to deposition. This initial chamber conditioning step, or "silane soak" step, prior to the deposition step preferably is carried out by introducing $SiH_4$ into deposition chamber 12 via line 40. Valve 52 is opened, and all other valves remain closed.

Preferably, an argon bottom purge is carried out simultaneously with the $SiH_4$ step. The argon flowrate preferably is about 100 to 500 sccm, more preferably about 300 sccm.

The $SiH_4$ soak step preferably is carried out after the semiconductor substrate 28 is introduced into deposition chamber 12.

$SiH_4$ is preferably introduced into deposition chamber 12 in combination with the same noble carrier gas, e.g. argon, used in carrying out the subsequent deposition and $SiH_4$ purge steps. The $SiH_4$ soak step is preferably carried out for about 15 seconds to 1 minute, more preferably about 30 seconds. The flowrate of $SiH_4$ into deposition chamber 12 preferably is about 100 to 500 sccm, more preferably about 300 sccm, assuming a chamber volume of about 6 L. Chamber pressure during the conditioning step is preferably about 1 to 10 torr, more preferably about 2 torr.

Conditioning times will depend on both the $SiH_4$ flowrate and the chamber pressure. Thus, 15 seconds is the preferred minimum time for a $SiH_4$ flowrate of 500 sccm at a chamber pressure of 10 torr. About 30 seconds is sufficient for a flowrate of 300 sccm at 2 torr.

The temperature during the conditioning step typically is the same employed for the deposition step, about 500°–600° C., more preferably about 550° C. However, no minimum temperature is required for the conditioning step, since $SiH_4$ readily decomposes even at room temperature (25° C.).

The conditioning step can be carried out in combination with, or independent of, the $SiH_4$ purge step.

By conditioning deposition chamber 12 as described above prior to the DCS deposition step, more uniform $WSi_x$ deposition is realized. It is believed that the $SiH_4$ may serve as a catalyst to initiate deposition, and also may add a thin polysilicon layer to the surface of the semiconductor wafer prior to the DCS deposition process. Carrying out a $SiH_4$ soak step therefore is very preferred. However, when the DCS deposition process is carried out at an elevated temperature, for example above about 650° C., the $SiH_4$ soakstep may be omitted.

An exemplary process including a $SiH_4$ conditioning step, a DCS deposition step, and a $SiH_4$ purge step is shown in FIG. 5.

The invention is further illustrated by the following non-limiting examples.

EXAMPLE 1

In the example, two 8" semiconductor wafers were deposited with layers of $WSi_x$. The first wafer was processed according to a conventional silane method without a silane cap. The second wafer was processed according to a DCS method with preceding $SiH_4$ soak and subsequent $SiH_4$ capping steps according to the present invention, as follows.

Initially, the wafer was introduced into a 6 L vacuum deposition chamber, and $SiH_4$ (300 sccm) was introduced into the chamber together with argon (300 sccm) as carrier. The bottom of the chamber was simultaneously purged with argon (300 sccm). The $SiH_4$ soak step was carried out for 30 sec at 2 torr.

Subsequently, the wafer was heated to 565° C. in the chamber. $WF_6$ (3.5 sccm), DCS (175 sccm) and argon (600 sccm) were introduced into the chamber via a diffuser. The bottom of the chamber was purged with argon (300 sccm). Chamber pressure was 0.8 torr. $WSi_x$ deposition was carried out for 110 seconds.

After the deposition was completed, a silane capping step was carried out for 15 seconds. The total process time was 3 minutes.

Stresses in the $WSi_x$ film on each wafer are then determined using a Tencor FLX-2908 thin-film stress measurement instrument (available from Tencor Instruments). Each wafer is heated in a nitrogen atmosphere to a temperature of 900° C. over the course of 6 hours. The wafers are held at 900° C. for 30 minutes, then gradually cooled to room temperature (25° C.). Stress in each film was determined during both heating and cooling. Results are given in FIGS. 3 and 4, respectively.

Figure 3:
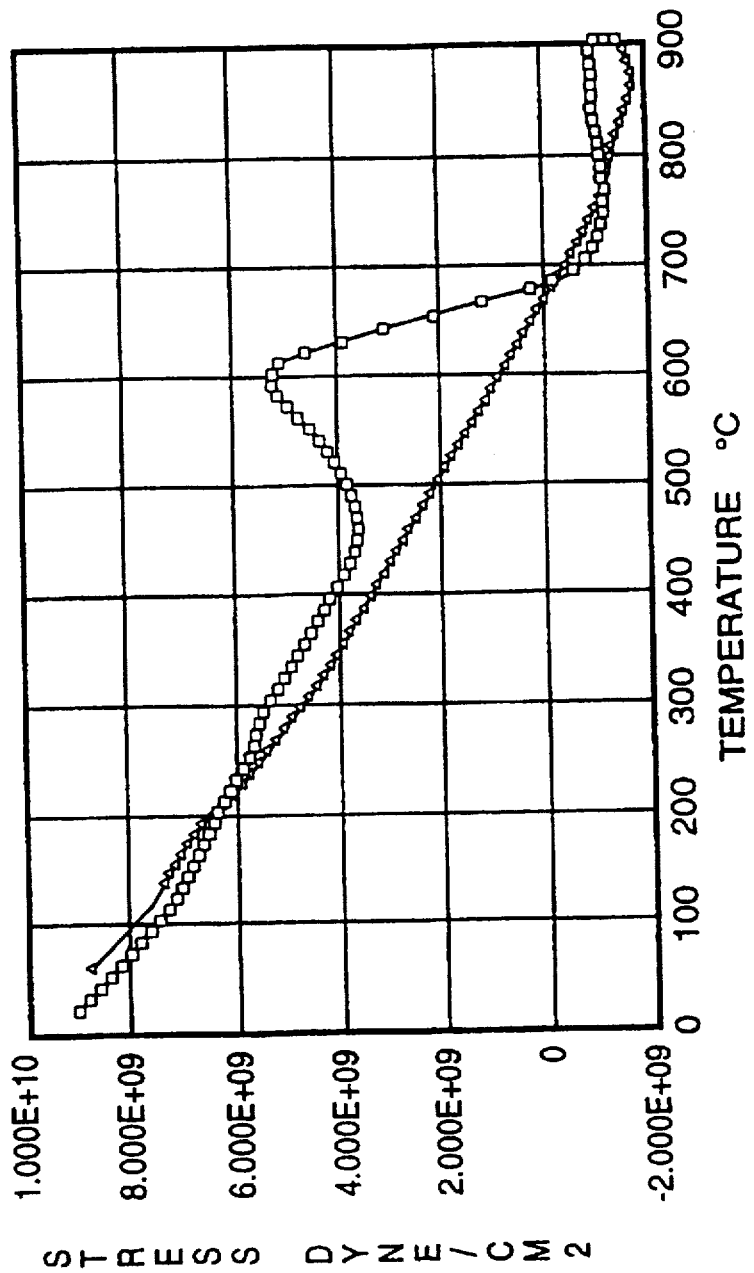
FIG. 3 is a graph of film stress measured during annealing as a function of temperature for a comparison $WSi_x$ film deposited on a semiconductor wafer according to a conventional DCS process, with values measured during heating of the film indicated by rectangles and values measured during cooling of the film indicated by triangles.
Figure 4:
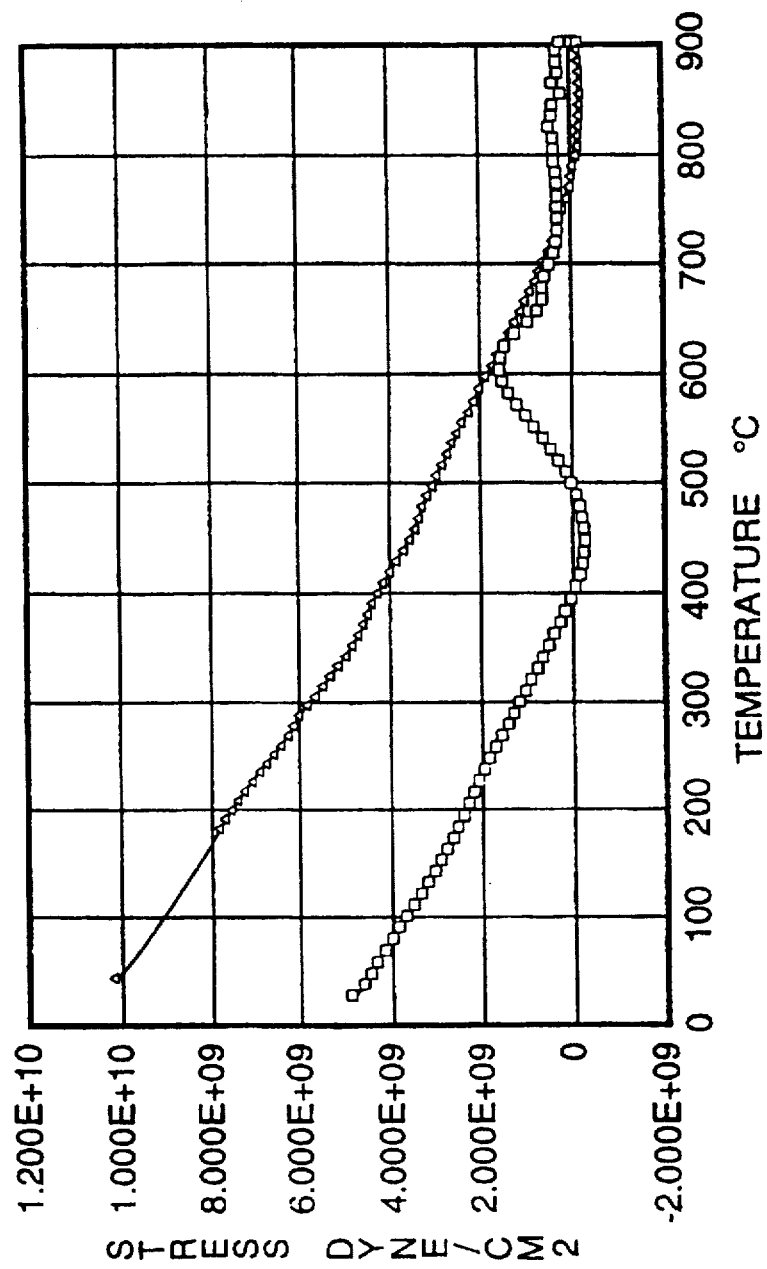
FIG. 4 is a corresponding graph of stress as a function of temperature for an exemplary $WSi_x$ film deposited on a semiconductor wafer according to a method of the present invention.

Comparison of FIGS. 3 and 4 shows the unexpected improvement in film stress achieved according to the present invention. The exemplary film produced according to the inventive process shows significantly lower stress than does a comparison film formed according to the previously known DCS process over a range of temperatures including the range (about 500°–600° C.) in which the deposition process typically is carried out.

More particularly, $WSi_x$ films produced according to both the known and the inventive methods exhibit hysteresis in the stress measured during film annealing and subsequent cooling. In the exemplary film produced according to the invention (FIG. 4), the stress as determined during heating is lower than the stress determined during cooling over the temperature range from about room temperature to about 600° C. Stress varied slightly between about 400° and 600° C. In the comparison film of FIG. 3, the stress as determined during heating becomes higher than that determined during cooling at about 200° C., and remains higher up to at temperature of about 675° C.

The exemplary film of FIG. 4 also differs from the comparison film of FIG. 3 in that the film stress exhibits a negative value over a range of temperatures from about 400° to about 500° C. That is, the exemplary film exhibits compression rather than tension over the foregoing temperature range, while the comparison film always exhibits tension.

The exemplary film exhibits a local maximum in stress at about 600° C., similarly to the comparison film. However, in the exemplary film, the measured stress at this temperature is much lower than the stress in the comparison film. Furthermore, both the rate of change in stress and the total reduction in stress shown by the comparison film during heating in the temperature range above about 600° C. are much greater than those shown by the exemplary film. That is, the exemplary film shows a much smoother transition in stress in this temperature range.

While not wishing to be bound by any particular theory, we believe that the behavior of films produced according to the invention may be explained as follows. $WSi_x$ films are mixtures of two phases, hexagonal and tetragonal. During annealing, as the temperature is increased over the range from about 400° C. to 700° C., the hexagonal phase transforms into the tetragonal phase. By about 900° C., the films are comprised substantially completely of the tetragonal phase. From this point, whether produced by conventional methods or methods according to the invention, $WSi_x$ films will behave similarly on cooling.

Stress in the films is observed to decrease on heating until the transitional temperature range is reached, at which point stress begins to increase as the phase transition begins. In films produced according to methods of the invention, the stresses at the beginning of the annealing process are much lower than the stresses in films produced according to prior art processes. The stresses remain significantly lower than the stresses in the prior art films during pre-transition heating, as shown, and can assume zero or even negative (compressive) values in this regime, although negative values will not necessarily be realized in every film produced according to the invention.

It is believed that the reduction in stress shown by films produced in accordance with methods of the invention may be accomplished as follows. The processed semiconductor wafers remain in the chamber while $SiH_4$ purges the chamber. $SiH_4$ reacts with residual tungsten atoms present on the surface of the wafers, and with residual $WF_6$, thus forming a silicon-rich $WSi_4$ layer having a thickness of approximately 1–2 Å on top of the layer formed during the DCS deposition process (hence the alternate reference to the $SiH_4$ purge step as a "cap" step). The reaction adds silicon to the films at the grain boundaries of the films and fills pores in the films, thus releasing stress in the films. It is further believed that the $SiH_4$ purge may actually result in a slight increase in sheet resistance.

EXAMPLE 2

Sheet resistance was measured in semiconductor wafers processed according to the conventional and inventive processes described in Example 1, above. The value of the sheet resistance was measured at 49 different sites over the surface of the wafers, and the average value and standard deviation of the measured values were calculated. The standard deviation is denoted herein as the "uniformity" of the sheet resistance. A high "uniformity" value thus indicates a large variation of sheet resistance from site to site over the surface of the wafer.

Figure 6A:
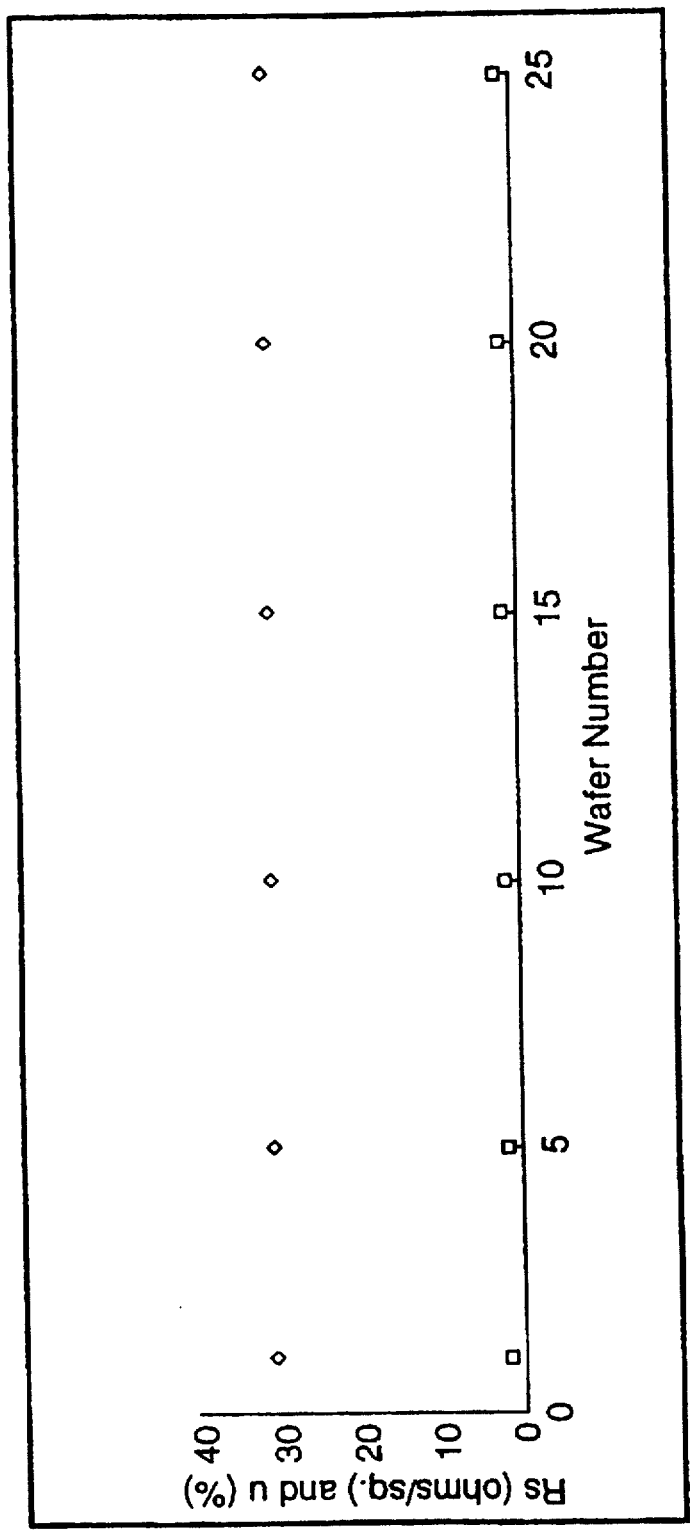
Figure 6B:
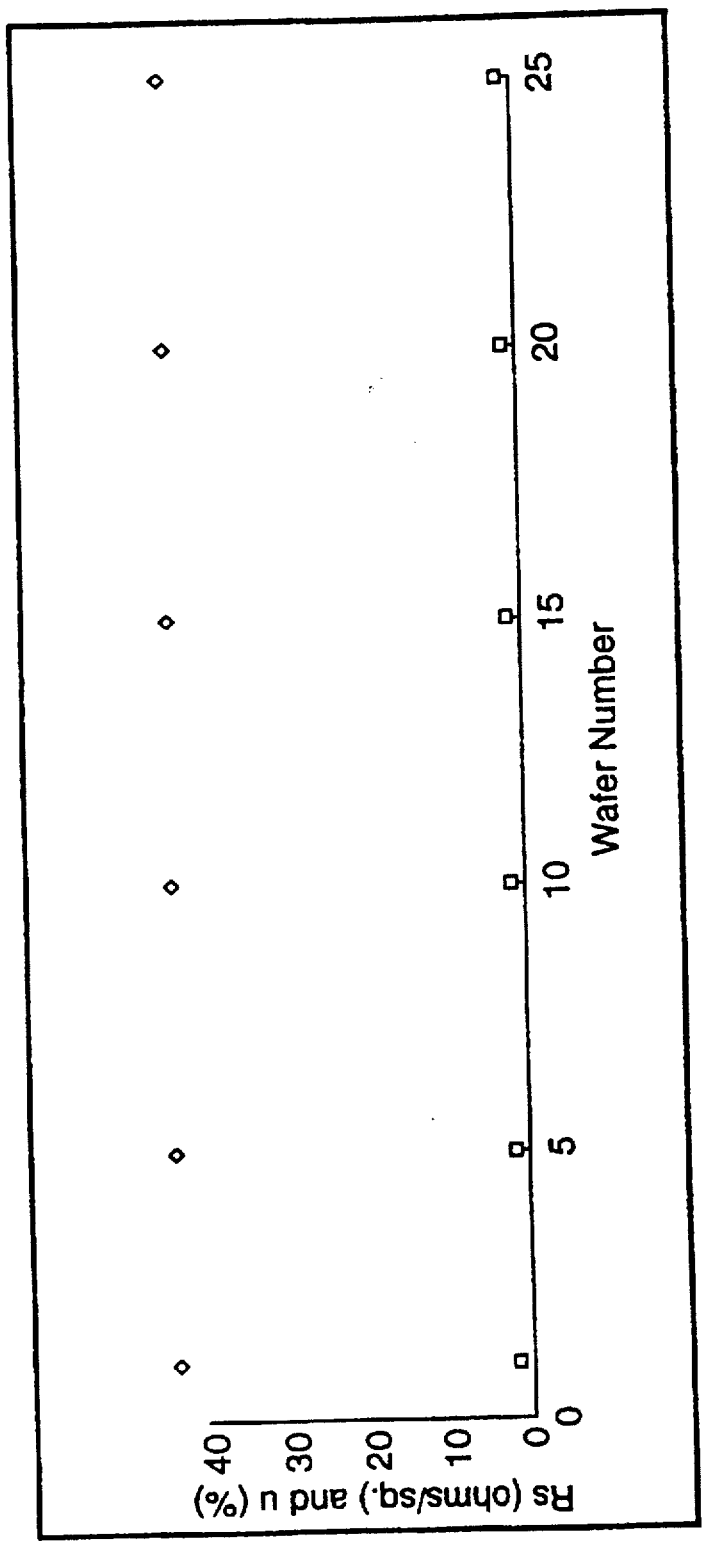

FIGS. 6A and 6B show the short-term drift in sheet resistance, measured in Ω/square (◇), and uniformity (□) in %, over 25 wafers for the conventional process and the inventive process, respectively. Sheet resistance as measured for the conventional process varied from 31 to 29 Ω/square, for a decrease of about 2 Ω/square (about 6.5%). For the inventive process, the sheet resistance varied from 44.4 to 44.6 Ω/square, within experimental error. Uniformity for the conventional process varied from about 1.7% to 2.4%; for the inventive process, the variation was from about 1.83% to 1.75%. As is apparent, the inventive process affords significantly reduced short-term downward drift in sheet resistance.

Figure 6C:
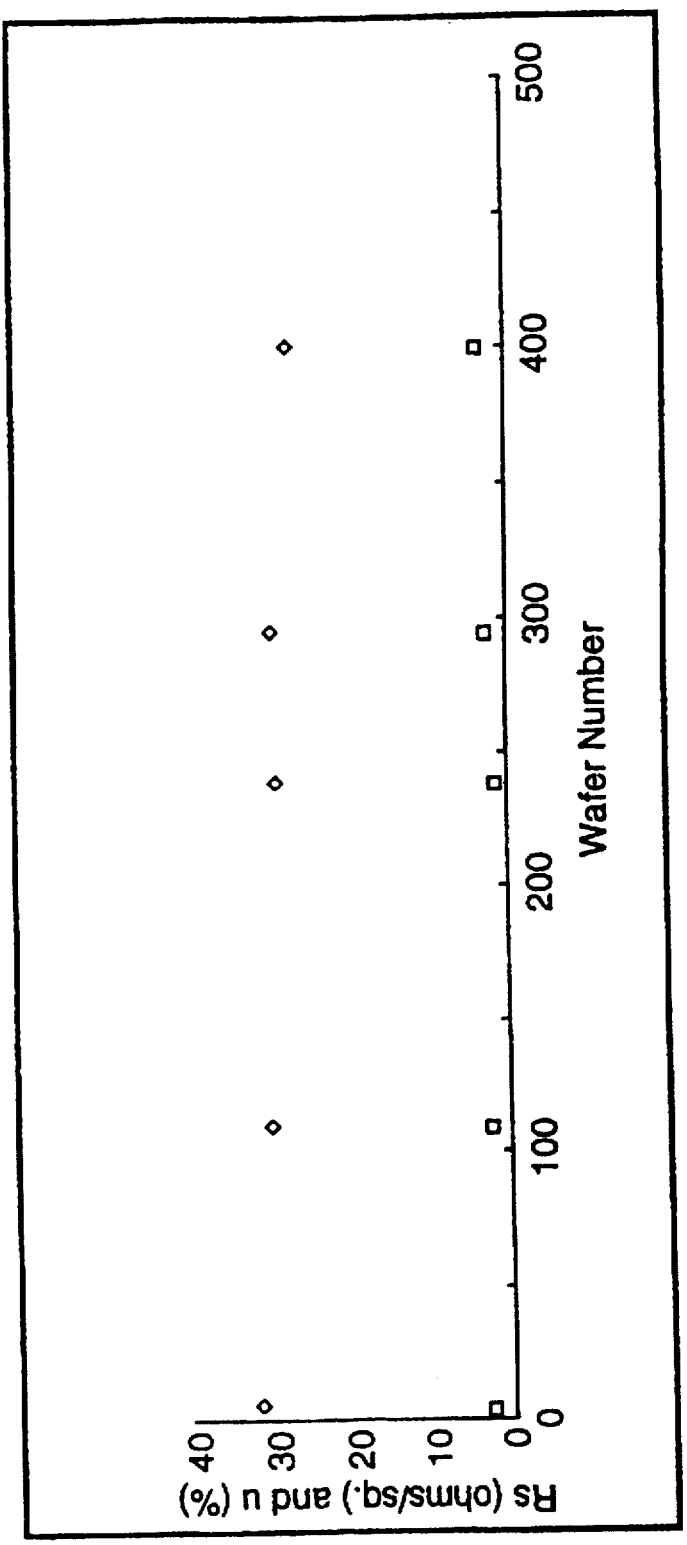
Figure 6D:
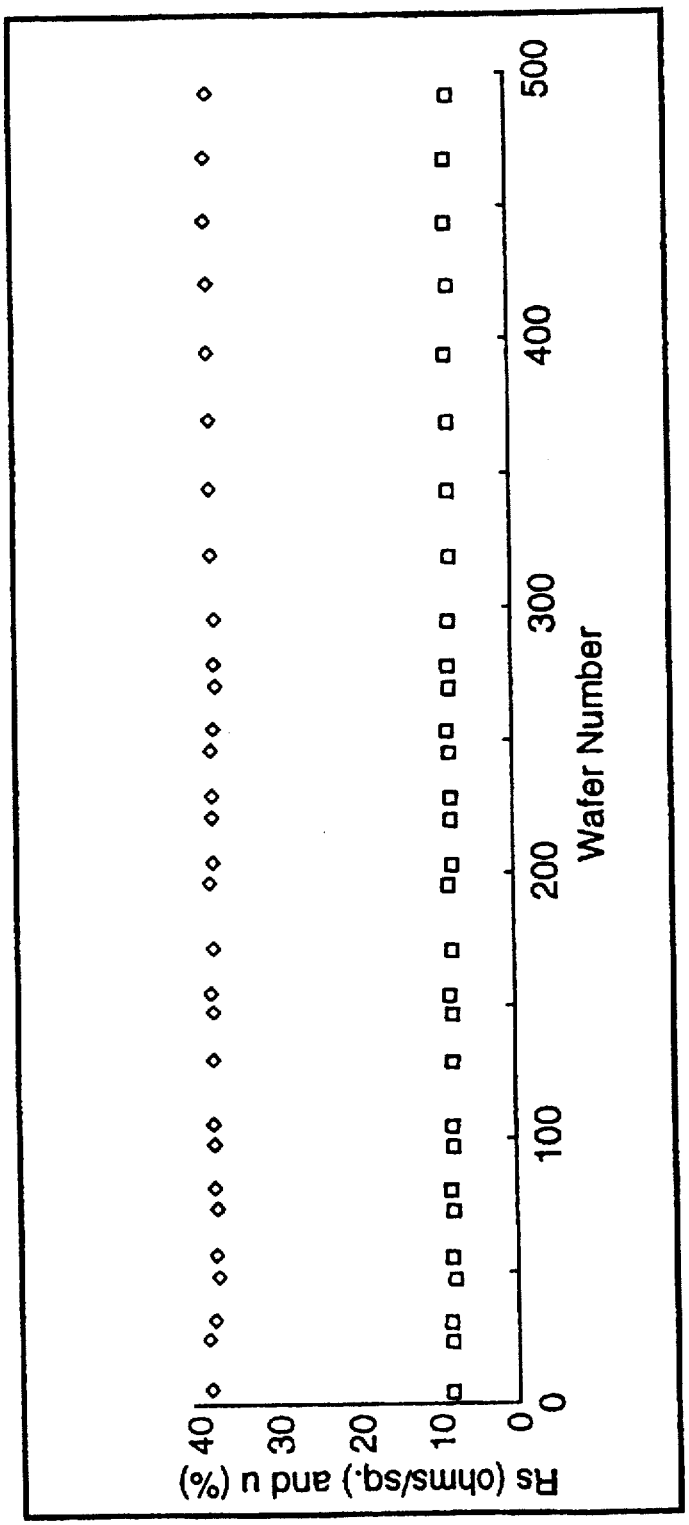

FIGS. 6C and 6D show corresponding long-term drifts in sheet resistance and uniformity over 500 wafers for the conventional process and the inventive process, respectively. Sheet resistance was measured for the first wafer in each batch of 25 wafers. After 25 wafers were processes, the vacuum deposition chamber was cleaned, and the process was repeated for the next 25 wafers.

For the conventional process, sheet resistance varied from 31 to 27 Ω/square, for a decrease of about 4 Ω/square (about 13%). For the inventive process, the sheet resistance varied from 44.5 to 43 Ω/square, for a decrease of about 1.5 Ω/square (about 3%). Uniformity for the conventional process was observed to increase from about 2% to 3.5%; for the inventive process, the variation was from about 1% to 1.8%, with no trend upward or downward observed. The inventive process thus affords significantly reduced long-term downward drift in sheet resistance as compared to the conventional process, as well as improved uniformity.

Furthermore, after 500 wafers the conventional process required an upward adjustment of the pressure during deposition, to about 1.2 torr, in order to produce deposited films having acceptable sheet resistance. No such upward adjustment was required in the inventive process.

Although the invention has been illustrated primarily with reference to a DCS deposition process, the invention is not limited in its applicability to DCS processes or processes which deposit $WSi_x$ on a substrate. The $SiH_4$ conditioning and purge steps can be used with other deposition processes, particularly those which deposit a crystalline material on a substrate. Such materials include, for example, $TiSi_x$, $CoSi_x$, $TiCoSi_x$, etc.

Processing semiconductor wafers in accordance with the present invention results in a significant reduction in short- and long-term downward drift in sheet resistance, and enables production of more uniform wafers. The present invention in addition results in processed semiconductor wafers having significantly reduced film stress.

What is claimed is:

1. A method of processing a substrate in a chamber of a vacuum processing apparatus, comprising the steps of:
   (i) depositing a silicide on a surface of said substrate, and
   (ii) purging said chamber of residual gases remaining from said deposition step by flowing dichlorosilane, DCS, into said chamber.

2. The method of claim 1 further comprising the step of:
   (iii) purging said chamber of residual gases remaining from said DCS purge by flowing $SiH_4$ into said chamber.

3. The method of claim 1 wherein in step (I) $WSi_x$ is deposited on said surface of said substrate.

4. The method of claim 1 wherein in step (ii) said DCS is combined with a noble gas.

5. The method of claim 2 wherein in step (iii) said $SiH_4$ is combined with a noble gas.

6.
   (i) depositing $WSi_x$ on a surface of said substrate using a mixture comprising $WF_6$, dichlorosilane and a noble gas; and
   (ii) purging said chamber of residual $WF_6$ by flowing dichlorosilane, DCS, into said chamber.

7. The method of claim 6 further comprising the step of (iii) purging said chamber of residual WF$_6$ and DCS by flowing SiH$_4$ into said chamber.

8. The method of claim 6 wherein step (ii) is carried out for about 1 to about 10 seconds.

9. The method of claim 7 wherein step (iii) is carried out for about 10 to about 30 seconds.

10. The method of claim 7 wherein the flow rate of said DCS in step (ii) is about 130 to 300 SCCM.

11. A method of processing a substrate in a processing chamber, comprising the steps of:

(i) introducing said substrate into said chamber;

(ii) flowing SiH$_4$ into said chamber;

(iii) depositing a silicide on a surface of said substrate; and (iv) at least partially purging said vacuum processing apparatus by flowing dichlorosilane into said chamber.

12. The method of claim 11 further comprising the step of:

(v) purging said chamber of residual gases by flowing SiH$_4$ into said chamber after ceasing the flow of dichlorosilane into said chamber.

13. The method of claim 12 wherein the step of depositing a silicide comprises combining WF$_6$, dichlorosilane and a noble gas and introducing the mixture into the chamber.

* * * * *

UNITED STATES PATENT AND TRADEMARK OFFICE
CERTIFICATE OF CORRECTION

PATENT NO. : 5,780,360
DATED : July 14, 1998
INVENTOR(S) : Jennifer Meng Chu Tseng, et al It is certified that error appears in the above-identified patent and that said Letters Patent is hereby corrected as shown below:

Title page, item [54] and Column 1,
in the title after "Processes" please delete "DICHLOROSILANE", and before "Purge" insert --DICHLOROSILANE--.

In Figure 2, number 66, please replace "WF$_3$" with --NF$_3$--.

In column 1, line 64, please replace "SiH" with --SiH$_4$--.

In column 9, line 59, please replace "68" with --6B--.

In column 10, line 62, after "6" please insert --A method of processing a substrate in a chamber of a vacuum processing apparatus, comprising the steps of:--.

Signed and Sealed this

Fifteenth Day of August, 2000

Attest:

Q. TODD DICKINSON

*Attesting Officer*  *Director of Patents and Trademarks*